(12) United States Patent
Nagai (10) Patent No.: US 12,501,765 B2
(45) Date of Patent: Dec. 16, 2025

(54) WHITE LIGHT ORGANIC EL ELEMENT AND ILLUMINATING DEVICE COMPRISING GREEN RED LIGHT EMITTING UNIT AND BLUE LIGHT EMITTING UNIT

(71) Applicant: KANEKA CORPORATION, Osaka (JP)

(72) Inventor: Naomi Nagai, Otsu (JP)

(73) Assignee: KANEKA CORPORATION, Osaka (JP)

(*) Notice: Subject to any disclaimer, the term of this patent is extended or adjusted under 35 U.S.C. 154(b) by 386 days.

(21) Appl. No.: 18/248,571

(22) PCT Filed: Oct. 27, 2021

(86) PCT No.: PCT/JP2021/039575
§ 371 (c)(1),
(2) Date: Apr. 11, 2023

(87) PCT Pub. No.: WO2022/092131
PCT Pub. Date: May 5, 2022

(65) Prior Publication Data
US 2023/0389348 A1    Nov. 30, 2023

(30) Foreign Application Priority Data
Nov. 2, 2020   (JP) .................................. 2020-183598

(51) Int. Cl.
*H10K 50/125*   (2023.01)
*F21V 33/00*    (2006.01)
(Continued)

(52) U.S. Cl.
CPC ....... *H10K 50/125* (2023.02); *F21V 33/0048* (2013.01); *H10K 50/19* (2023.02); *H10K 50/131* (2023.02)

(58) Field of Classification Search
None
See application file for complete search history.

(56) References Cited

U.S. PATENT DOCUMENTS

2006/0232202 A1   10/2006   Matsuda et al.
2010/0078631 A1   4/2010    Pieh
(Continued)

FOREIGN PATENT DOCUMENTS

JP    2006324016 A    11/2006
JP    2015070866 A    4/2015
(Continued)

OTHER PUBLICATIONS

European Patent Office, Supplementary European Search Report Issued in Application No. EP21886249, Mar. 15, 2024, 2 pages.
(Continued)

*Primary Examiner* — Daniel Whalen
(74) *Attorney, Agent, or Firm* — Alleman Hall & Tuttle LLP (57) ABSTRACT

An organic electroluminescent element capable of emitting white light having a low color temperature and high color rendering properties with practical power efficiency includes a light-pervious substrate, a light-pervious anode layer, a light-emitting functional layer, and a metal cathode layer. The functional layer includes a green red light emitting unit, a unit connection mechanism, and a blue light emitting unit. The green red light emitting unit includes a green red mixed phosphorescent light-emitting layer containing a host material for a phosphorescent light-emitting layer, and the blue light emitting unit includes a hole transport adjustment layer adjacent to a blue fluorescent light-emitting layer on a side of the unit connection mechanism. White light can be emitted from the light emission surface with a correlated color temperature TCP of 2200 K to 3000 K and a color rendering property Ra of 80 or more.

12 Claims, 5 Drawing Sheets

(51) Int. Cl.
    *H10K 50/19*     (2023.01)
    *H10K 50/13*     (2023.01)

(56) References Cited

U.S. PATENT DOCUMENTS

| | | | |
|---|---|---|---|
| 2011/0122626 A1* | 5/2011 | Huang | F21V 21/32 |
| | | | 362/253 |
| 2016/0064682 A1 | 3/2016 | Yamae et al. | |
| 2020/0313045 A1 | 10/2020 | Asai et al. | |
| 2021/0296607 A1* | 9/2021 | Spindler | H10K 50/82 |

FOREIGN PATENT DOCUMENTS

| | | | |
|---|---|---|---|
| JP | 2015088241 A | 5/2015 |
| JP | 2017045650 A | 3/2017 |
| JP | 2020167399 A | 10/2020 |
| WO | 2014185063 A1 | 11/2014 |

OTHER PUBLICATIONS

Megumi Hatori and Satchidananda Panda, "The emerging roles of melanopsin in behavioral adaptation to light" Trends in Molecular Medicine, 16-10, pp. 435-446 (2010).
International Bureau of WIPO, International Preliminary Report on Patentability Issued in Application No. PCT/JP2021/039575, May 2, 2023, WIPO, 4 pages.

* cited by examiner

FIG. 8

WHITE LIGHT ORGANIC EL ELEMENT AND ILLUMINATING DEVICE COMPRISING GREEN RED LIGHT EMITTING UNIT AND BLUE LIGHT EMITTING UNIT

TECHNICAL FIELD

The present invention relates to an organic EL element and an illuminating device on which the organic EL element is mounted, and particularly relates to an organic EL element that emits specific white light.

BACKGROUND ART

An organic EL element is a semiconductor element that converts electric energy into light energy, and an organic EL device including the organic EL element attracts attention because the organic EL device emits thin and planarly soft diffused light as a light source in place of an incandescent lamp or a fluorescent lamp, and much research has been done on the organic EL element in recent years.

For example, a bottom emission type organic EL element is generally obtained by sequentially laminating a light-pervious anode layer, a functional layer including at least a light emitting layer containing an organic compound, and a metal cathode layer on a glass substrate or a light-pervious resin film substrate serving as a substrate. In the organic EL element, electrons and holes electrically excited by power supply between these electrodes are recombined in the light emitting layer to emit light.

For practical use of such an organic EL element, further improvement in efficiency, luminance, and color rendering properties, and further, a bioactivity effect are also required in recent years.

For example, Patent Document 1 discloses a light source module that can achieve both a bioactivity effect of adjusting a circadian rhythm, which is an internal clock that goes around in a 24 hour cycle, and good skin appearance.

The light source module of Patent Document 1 includes a solid-state light-emitting element and a wavelength converter, and has a degree of bioactivity (DIN) of at least 0.85, which is calculated from a spectral distribution of composite light emitted from the wavelength converter and indicates melatonin secretion suppression effect. A correlated color temperature TCP of the composite light is 5000K or more and less than 7100K. A preference index of skin color (PS) calculated from the spectral distribution of the composite light is at least 60.

Specifically, Patent Document 1 discloses a white light source capable of emitting white light, where a spectral distribution of the composite light has a first peak wavelength in a range of 400 nm to 470 nm, a second peak wavelength in a range of 471 nm to 550 nm, and a third peak wavelength in a range of 551 nm to 670 nm. An interval between the second peak wavelength and the third peak wavelength is in a range of 80 nm to 120 nm. An average color rendering index Ra according to JIS Z 8726 is 85. A preference index of skin color is 80.

Furthermore, for example, Patent Document 2 discloses a light source module showing a good bioactivity effect for adjusting the circadian rhythm as well as good skin appearance.

The light source module of Patent Document 2 includes a first light emitting device 1, a second light emitting device 2, and a third light emitting device 3 each having a different emission spectrum.

In the light source module of Patent Document 2, a degree of bioactivity (DIN) indicating the melatonin secretion suppression effect is greater than or equal to 0.85, and a correlated color temperature TCP of the first composite light is greater than or equal to 5000 K and less than or equal to 7100 K, which are calculated from a spectral distribution of first composite light in which light emitted from the first light emitting device 1 and light emitted from the second light emitting device 2 are combined. A preference index of skin color (PS) is greater than or equal to 60, which is calculated from the spectral distribution of the first composite light. DIN is less than or equal to and a correlated color temperature TCP of the second composite light is greater than or equal to 2000 K and less than or equal to 3250 K, which are calculated from a spectral distribution of second composite light in which light emitted from the second light emitting device 2 and light emitted from the third light emitting device 3 are combined.

Specifically, Patent Document 2 discloses a light emitting diode using a yellow phosphor having a peak wavelength in a range of 550 nm to 600 nm and a red phosphor having a peak wavelength in a range of 630 nm to 670 nm, realizing a spectral distribution of the composite light having a peak wavelength in a range of 400 nm to 470 nm and a second peak in a range of 550 nm to 670 nm. Patent Document 2 also discloses a white light source having a correlated color temperature TCP of 2000 K or more and less than 7100 K and an average color rendering index Ra of 80 according to JIS Z 8726 with a first light source (blue and red two-wavelength light source) having a low color temperature TCP and a second light source (blue and green two-wavelength light source) having a high color temperature TCP, the first and second light sources being alternately arranged to allow one of the light sources to be turned on depending on a predetermined timing.

However, the light source module of Patent Document 2 has a problem that glare is likely to occur by switching between the first light source and the second light source.

Furthermore, as described in Non-Patent Document 1, Brainard et al. reported in 2001 that melatonin secretion suppression in human is affected by a blue emission spectrum on a short wavelength side at either high or minimum illuminance and also depends on a spectrum in a 460 nm region on a slightly long wavelength side. Later, Thapan et al. reported that retinal ganglion cells (ipRGCs) having photosensitivity and containing a substance called melanopsin are related to melatonin secretion suppression.

Furthermore, temporal physiology Vol. 14. No 1 (2008) also describes a relationship between a human and melatonin secretion suppression with relation to a blue region spectrum.

PRIOR ART DOCUMENTS

Patent Documents

Patent Document 1: JP 2015-070866 A
Patent Document 2: JP 2015-088241 A
Non-Patent Document 1: Hatori & Panda: The emerging roles of melanopsin in behavioral adaptation to light, Trends in Molecular Medicine, 16-10, pp. 435-446 (2010)

DISCLOSURE OF INVENTION

Technical Problem

As described above, in the melatonin secretion according to the prior arts, the high color temperature TCP illumination that strengthens the blue light emitting region is used in order to suppress the melatonin secretion of the human in an active time zone.

Humans also produce melatonin that prompts sleep and go to bed at the time of maximum melatonin secretion.

When humans sense light from the eye, melatonin secretion is suppressed, but melatonin secretion is influenced in particular by the spectrum of the blue light emitting region. Therefore, in the illumination at night, it is considered that the melatonin secretion should be avoided by using the low color temperature TCP illumination, which is obtained by cutting the blue light emitting region as much as possible.

In view of the above, an object of the present invention is to provide an organic EL element capable of emitting white light that is whiter at a lower color temperature than conventional ones and that has high color rendering properties with practical power efficiency.

Furthermore, an object of the present invention is to provide an illuminating device that can be fixed to an object to be viewed such as a book and that can illuminate the object to be viewed in a desired posture by using an organic EL panel.

Solution to Problem

With respect to the above-described problems of the present invention, since melatonin generation in the body is derived from stimulation to retinal nerve cells of the eye, the present inventor has paid attention to a Melanopic Ratio value as an index of a degree of stimulation to retinal nerve cells of the eye, and has tried a measure for reducing a blue emission spectrum intensity in order to reduce light in a blue region that acts to suppress melatonin generation at the time of introducing sleep.

However, in a case where the blue emission spectrum intensity is reduced, in order to improve power efficiency, it is necessary to enhance the green emission and red emission spectra, and there is a problem that the average color rendering index Ra decreases. On the other hand, when the average color rendering index Ra is to be adjusted in a high direction, it is necessary to adjust the green light emission and red light emission spectrum intensities to be weakened, so that the green light emission intensity of the high luminous efficiency is reduced, and there is a problem that the power efficiency is also likely to be reduced.

Here, the Melanopic Ratio value is calculated by a Melanopic Ratio method.

With regard to the Melanopic Ratio method, The WELL Building Standard (WELL) discloses Tool Box which is a simulation method.

Furthermore, in relation to the Melanopic Ratio value, the white light source also needs to lower the blue light emission intensity.

The present invention relates to a balance of such a low color temperature TCP, and specifically, proposes a means for solving the problem that the lack of light in the blue region causes a defect in characteristics such as color rendering properties and a Melanopic Ratio value.

In general, the blue light emission intensity tends to decrease as a thickness of the blue light-emitting layer decreases and the content of the blue luminescent material decreases.

Figure 7:
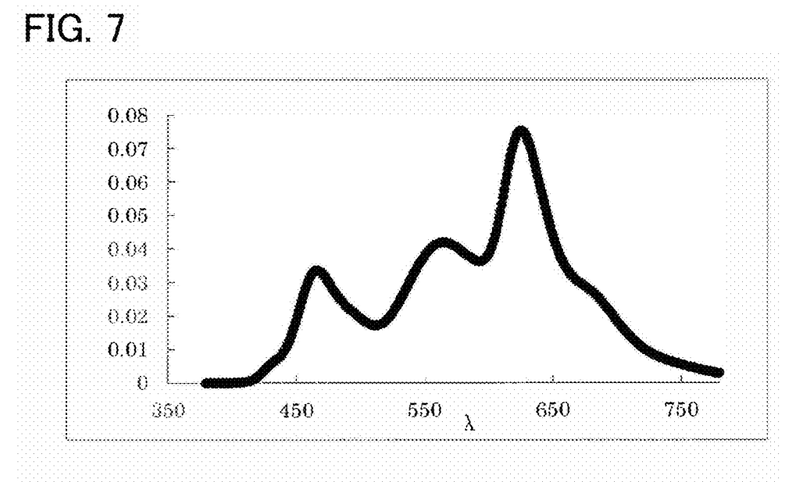
FIG. 7 is a front emission spectrum of the organic EL element of Example 3.

However, in the conventional structure, as illustrated in FIG. 7, even in a case where the fluorescent blue light-emitting layer was designed to have 3 nm and the blue luminescent material was designed to have 1 wt %, the blue light emission intensity was higher than expected, the color temperature TCP was 3000 K or less, and the Melanopic Ratio value was 0.632. Therefore, it is necessary to newly design an element.

As means for solving such problems, the present invention aims to improve efficiency, for example, by sufficiently separating a green and red phosphorescent unit from a reflective cathode side so that the green and red phosphorescent unit is hardly affected by plasmon loss.

Furthermore, an organic EL element that emits white light using a hole transport layer on a blue unit side as an adjustment layer is proposed so that the blue light emission intensity can be weakened and a distance duv from a black-body radiation curve can be 0.02 or less.

One aspect of the present invention is an organic EL element including a light emission surface and a back surface as both main surfaces, the organic EL element including: a light-pervious substrate; a light-pervious anode layer; a light-emitting functional layer; and a metal cathode layer in order from a side of the light emission surface, the light-emitting functional layer including: a green red light emitting unit; a unit connection mechanism; and a blue light emitting unit, the unit connection mechanism being configured to inject electrons to a side of the green red light emitting unit and holes to a side of the blue light emitting unit when energized, the green red light emitting unit including a green red mixed phosphorescent light-emitting layer that includes: a green phosphorescent material; a red phosphorescent material; and a host material for a phosphorescent light-emitting layer, the green red light emitting unit emitting green light and red light when energized, the blue light emitting unit including: a blue fluorescent light-emitting layer that emits blue light when energized; and an HTL adjustment layer adjacent to the blue fluorescent light-emitting layer on a side of the unit connection mechanism, the HTL adjustment layer being a hole transporting layer having an average thickness of 50 nm or more, wherein the EL element is configured to emit white light from the light emission surface, the white light having: a correlated color temperature TCP of 2200 K to 3000 K; a distance duv of 0.02 or less, the distance duv referring to a distance from a black-body radiation curve to a coordinate position of the white light in a CIE1931 chromaticity coordinate system; a color rendering property Ra of 80 or more; and a Melanopic Ratio value of 0.65 or less.

That is, the present invention provides an organic EL element including a light emission surface and the back surface as both main surfaces, wherein white light is emitted from the light emission surface, the white light having a color temperature TCP of 2200 K to 3000 K, a distance duv of 0.02 or less, the distance duv referring to a distance from a black-body radiation curve to a coordinate position of the white light in a CIE1931 chromaticity coordinate system, a color rendering property Ra related to color reproducibility of 80 or more, and a Melanopic Ratio value of 0.65 or less as an index of a degree of stimulation to retinal nerve cells of an eye, wherein the organic EL element includes: a light-pervious substrate; a light-pervious anode layer; a light-emitting functional layer; and a metal cathode layer in order from a side of the light emission surface, the light-emitting functional layer including: a green red light emitting unit; a blue light emitting unit; and a unit connection mechanism, both of the green red light emitting unit and the blue light emitting unit including a hole transporting surface and an electron transporting surface as both surfaces, the unit connection mechanism is configured to inject electrons into a side of the green red light emitting unit and holes into a side of the blue light emitting unit, the green red light emitting unit emitting green light and red light, the blue light emitting unit including a blue fluorescent light-emitting layer that emits blue light, the green red light emitting unit further including a green red mixed phosphorescent light emitting layer that includes a green color phosphorescent material, a red color phosphorescent material, and a host material for a phosphorescent light-emitting layer, the blue light emitting unit including an HTL adjustment layer as a hole transporting layer having an average thickness of 50 nm or more adjacent to the blue fluorescent light-emitting layer on a side of the unit connection mechanism.

The "correlated color temperature" as used herein refers to a correlated color temperature in accordance with JIS Z 8725:2015.

The "Melanopic Ratio value" can be obtained by the following Formula (1).

[Mathematical formula 1]

$$\text{Melanopic Ratio Value} = \frac{\sum_{730}^{380} \text{Lamp} \times \text{Circadian}}{\sum_{730}^{380} \text{Lamp} \times \text{Visual}} \times 1.218 \quad (1)$$

Here, Lamp represents a spectral distribution of the organic EL element, Circadian represents a sensitivity curve (absorbance) of ipRGC, which is a photoreceptor in the retina of mammals, and Visual represents a visibility curve in human photopic vision.

Furthermore, Lamp×Circadian represents a circadian response included in the spectral distribution of the organic EL element, and Lamp×Visual represents a visibility response included in the spectral distribution of the organic EL element.

According to this aspect, since white light having a low blue light emission intensity and a high color rendering property is emitted, a load for visual recognition of objects including color tones is reduced, which is gentle to the eyes in a living environment at night, and can contribute to improvement of the quality of sleep, and is suitable as wellness illumination.

In general, when the blue light emission amount is reduced, the light emission balance is lost, and the color rendering property Ra value related to color reproducibility tends to decrease. Furthermore, as the illumination light, white light close to natural light (sunlight) is preferred.

That is, the load required for visual recognition is small and the user is less likely to be tired, and duv, which is a deviation (distance) from black-body radiation that can be regarded as natural light, is used as a measure related to such closeness, and light with small duv is preferred as the illumination light.

According to this aspect, the white light emitted from the light emission surface has a Melanopic Ratio value of 0.65 or less, and also has color reproducibility of 80 or more and duv of 0.02 or less.

In general, when the green emission intensity is lowered in order to reduce duv, the visibility is lowered.

However, according to this aspect, by adjusting the spectral intensity ratio between red and green, an organic EL element in which power efficiency falls within a practical range is obtained.

According to this aspect, the white light emitting organic EL element is excellent in efficiency, luminance, and color rendering properties, and an effect of reducing melatonin suppression can be expected.

According to this aspect, the green and red mixed phosphorescent light-emitting layer is included. That is, this aspect does not use a stacked light-emitting layer that includes different-colored unmixed sub-layers, one of which is a green phosphorescent light-emitting layer that does not include red phosphorescent material but includes green phosphorescent material and host material, and another of which is a red phosphorescent light-emitting layer that does not include green phosphorescent material but includes red phosphorescent material and host material, with the interface between the green phosphorescent emitting layer and the red phosphorescent emitting layer as the emission interface. Instead, a single light-emitting layer that mixes the different colors is used. That is, in this aspect, the green and red mixed phosphorescent light-emitting layer including the green color phosphorescent material, the red color phosphorescent material, and the host material for the phosphorescent light-emitting layer constitutes a single layer.

In this way, the ratio of the green phosphorescence to the red phosphorescence is kept constant without being affected by the position of the emission interface that moves depending on the amount of current, and the change in color tone due to the magnitude of the current can be minimized. That is, high reliability can be secured with respect to color rendering properties and whiteness.

As described above, according to the present aspect, it is possible to emit white light having a low color temperature TCP at which blue light emission is suppressed, less irritation to the eyes, and high color rendering properties with practical power efficiency. Therefore, it is possible to emit white light which is suitable as warm color illumination light gentle to the eyes in a nighttime living environment and can contribute to improvement of the quality of sleep.

In a preferred aspect, the Melanopic Ratio value is 0.5 or less, the blue light emitting unit comprises the blue fluorescent light-emitting layer as a light-emitting layer closest to the metal cathode layer, and the blue fluorescent light-emitting layer includes: a blue color fluorescent material; and a host material for fluorescent light emission.

According to the present aspect, the effect of the present invention can be further performed.

In a more preferred aspect, the HTL adjustment layer includes a green fluorescent light-emitting layer including: a green fluorescent material; and a hole-transporting host material for fluorescent light emission, and a maximum emission peak wavelength of the blue fluorescent material and a maximum emission peak wavelength of the green phosphorescent material are separated from each other by 100 nm or more.

According to this aspect, a higher efficiency element is obtained.

In a preferred aspect, a spectrum of the white light has one blue emission peak in a range of 450 nm to 470 nm, one green emission peak in a range of 500 nm to 580 nm, and one red emission peak in a range of 590 nm to 630 nm, and in the spectrum of the white light, defining an emission intensity of the blue emission peak as 1, an emission intensity of the green emission peak is 2.5 times or more and 3.0 times or less.

According to this aspect, a high-performance element is obtained.

Furthermore, preferably, the light-emitting functional layer includes a relatively thin light emitting layer, such as an average layer thickness of 5 nm or more and 30 nm or less.

Due to the configuration of the present invention capable of suppressing the Melanopic Ratio value, it is possible to adjust the Melanopic Ratio value in the HTL adjustment layer of the fluorescence blue light-emitting unit that is adjacent to the cathode (metal cathode layer) side and that includes the blue fluorescent light-emitting layer emitting blue light.

Further, as described above, since the organic EL element of the above aspect can lower the suppression of the melatonin secretion, it is considered that the organic EL element can prevent the blocking of the subsequent sleep after work before going to bed at night, and it is considered that the organic EL element is suitable as illumination of an object to be viewed at night.

Furthermore, if the organic EL panel including the organic EL element of the above-described aspect can be changed to a desired position and a desired direction with respect to the object to be viewed, it is considered that practicality is enhanced.

One aspect of the present invention derived based on the above idea is an illuminating device including: an organic EL panel having the organic EL element; a holding portion holding the organic EL panel; a fixing portion fixing the organic EL panel to an object to be viewed; and a connecting unit connecting the holding portion to the fixing portion, the fixing portion being capable of changing a position and a direction of the holding portion with respect to the fixing portion, wherein light can be emitted from the organic EL panel toward the object to be viewed.

The term "object to be viewed" as used herein refers to an object or a structure visually recognized by a user, for example, a book or furniture such as a desk.

According to this aspect, by attaching the organic EL panel to the object to be viewed with the fixing portion and turning on the organic EL panel toward the object to be viewed, the burden on the eyes of the user is small even when the user sees the object to be viewed immediately before going to bed at night, and it is possible to suppress a decrease in the quality of sleep due to melatonin generation suppression by light. According to this aspect, since the position and orientation of the holding portion with respect to the fixing portion can be changed by the connecting unit, the attachment object can be illuminated in a state where the organic EL panel is in a desired posture.

Effect of Invention

The organic EL element of the present invention is white light at a low color temperature TCP at which blue light emission is suppressed, which is less irritating to the eye with respect to melatonin secretion generation, and can emit white light having high color rendering properties with practical power efficiency. Therefore, a load for visual recognition of objects including color eyes is reduced, and not only the light is suitable as warm color illumination light that is gentle to the eye in a nighttime living environment, but also the depth of sleep and an undesirable influence on the nerve cells of the retina of the eye can be suppressed. As a result, it can contribute to the improvement of the quality of sleep, and is suitable as a wellness illumination for further improving the living environment.

According to the illuminating device of the present invention, the organic EL panel can be fixed to an object to be viewed such as a book, and the object to be viewed can be illuminated in a desired posture.

BRIEF DESCRIPTION OF DRAWINGS

FIGS. 1A and 1B are explanatory views of an organic EL element in a first embodiment of the present invention, in which

BEST MODE FOR CARRYING OUT THE INVENTION

Hereinafter, embodiments of the present invention will be described in detail.

(Organic EL Element 10)

Figure 1A:
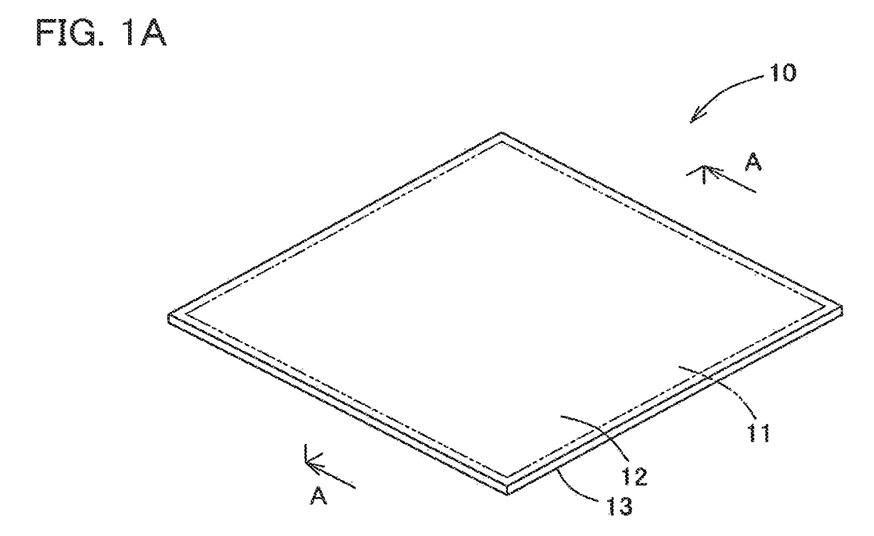
FIG. 1A is a perspective view of the organic EL element.

As illustrated in FIG. 1A, the organic EL element 10 according to the first embodiment of the present invention is a member which has a light emission surface 12 and a back surface 13 as both main surfaces, emits white light from a light emitting region 11 of the light emission surface 12, has a planar expanse, and is preferably a plate-like member.

Since the organic EL element 10 has a specific structure, white light suitable for wellness illumination is emitted with practical power efficiency.

The white light emitted from the light emission surface 12 of such an organic EL element 10 has a correlated color temperature TCP of 2200 K to 3000 K, a distance duv from a black-body radiation curve of a coordinate position in the CIE1931 chromaticity coordinate system of 0.02 or less, and a color rendering property Ra value (average color rendering index) related to color reproducibility of 80 or more. Furthermore, the white light has a Melanopic Ratio value of 0.65 or less, preferably 0.5 or less, as an index related to stimulation of retinal nerve cells of the eye, which is suitable as wellness illumination, with practical power efficiency.

Figure 1B:
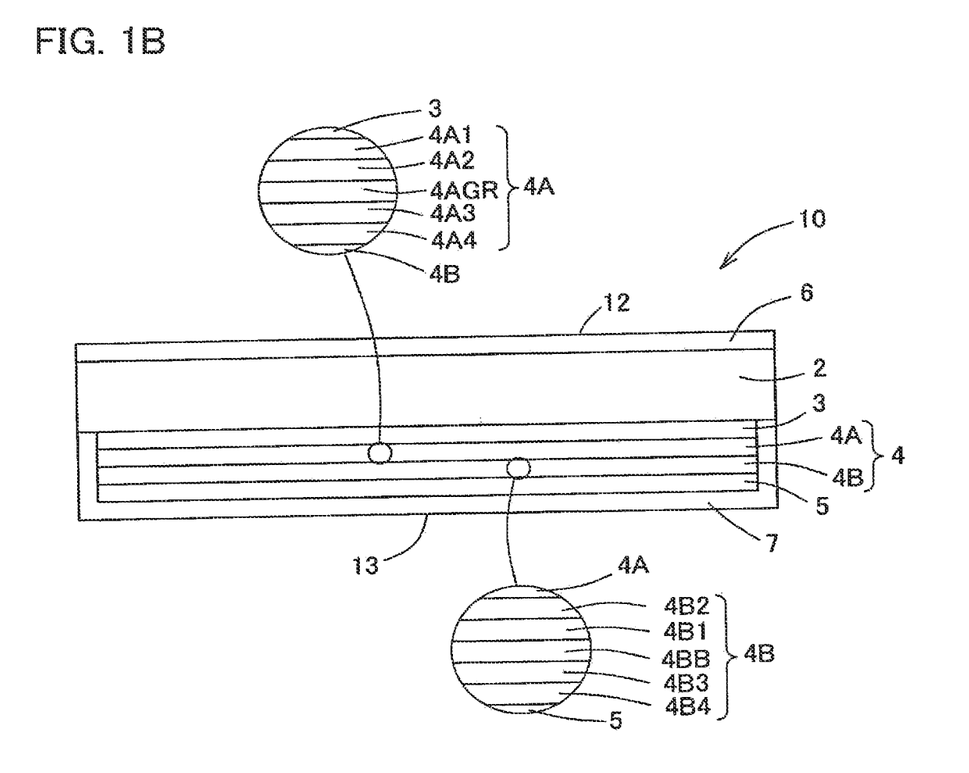
FIG. 1B is a cross-sectional view taken along line A-A of FIG. 1A. Note that hatching is omitted for easy understanding.

The organic EL element 10 preferably includes a sealing layer 7 that covers the entire surface of the light emitting region 11 on a side of the back surface thereof in a plan view as illustrated in FIGS. 1A and 1B from the viewpoint of suppressing occurrence of dark spots (DS) and element life shortening.

The spectrum of the white light preferably has one blue emission peak in a range of 450 nm to 470 nm, one green emission peak in a range of 500 nm to 580 nm, and one red emission peak in a range of 590 nm to 630 nm. When the blue emission peak intensity is 1, the intensity of the green emission peak emission is more preferably 2.5 times or more and 3.0 times or less.

As illustrated in FIG. 1B, the organic EL element 10 includes a light-pervious substrate 2, a light-pervious anode layer 3, a light-emitting functional layer 4 including a unit connection mechanism, and a metal cathode layer 5 in this order from a side of the light emission surface 12 toward a side of the back surface 13, and the overlapping portion thereof coincides with the light emitting region 11 in a plan view.

The unit connection mechanism is a mechanism having a function of connecting a plurality of light emitting units 4A and 4B included in the light-emitting functional layer 4.

One feature of the light-emitting functional layer 4 is that the light-emitting functional layer 4 includes specific green red light emitting units 4A and blue light emitting units 4B as light emitting units, and by including these light emitting units 4A and 4B, a connection function of a unit connection mechanism is developed, and the green red light emitting units 4A and the blue light emitting units 4B are electrically connected.

(Light Emitting Unit 4A, 4B)

The light emitting units 4A and 4B generally have a hole transporting surface and an electron transporting surface as both surfaces, are mainly composed of an organic compound, and are composed of a plurality of layers having hole transporting properties, electron transporting properties, and both charge transporting properties (also referred to as bipolar) capable of transporting charges of these holes and electrons.

As such an organic compound, a known material such as a low-molecular-weight dye material generally used in an organic EL element or a conjugated polymer material can be used, and a film can be formed by an appropriate known method such as a vacuum vapor deposition method, a sputtering method, a CVD method, or various coating methods. From the viewpoint of forming a high-performance element, a film is preferably formed by a vacuum vapor deposition method.

Furthermore, such light emitting units 4A and 4B can include a plurality of layers such as a hole injection layer (Hereinafter, it may be referred to as HIL), a hole transport layer (Hereinafter, it may be referred to as HTL), an electron transport layer (Hereinafter, it may be referred to as ETL), and an electron injection layer (Hereinafter, it may be referred to as EIL) as layers that do not actually emit light when the light emitting units 4A and 4B actually have light-emitting layers that emit light in the layers.

These layers other than the light emitting layers mainly have a function of promoting light emission in the light emitting layer, and these transport layers that do not emit light and layers having a function of light emission and transportation referred to as a hole transporting layer and an electron transporting layer in the present specification.

That is, the hole transporting layer refers to a layer that transports holes to the light emitting layer regardless of its own light emission and assists light emission of the light emitting layer. Furthermore, the electron transporting layer refers to a layer that transports electrons to the light emitting layer regardless of its own light emission function if the layer assists the light emission of the light emitting layer or not.

(Unit Connection Mechanism)

The unit connection mechanism has a function of connecting the green red light emitting unit 4A and the blue light emitting unit 4B, and specifically has a function of injecting electrons to a side of the green red light emitting unit 4A and injecting holes to a side of the blue light emitting unit 4B when the organic EL element 10 is energized.

(Light-Pervious Substrate 2)

The light-pervious substrate 2 is a member having a planar expansion and made of a light-pervious material, and can be a glass substrate or a resin film substrate. The light-pervious substrate 2 is preferably a glass substrate from the viewpoint of suppressing moisture ingress into the organic EL element 10, which causes performance deterioration, and may be a flexible substrate.

(Light-Pervious Anode Layer 3)

As a material of the light-pervious anode layer 3, a transparent conductive metal oxide such as indium tin oxide (ITO), indium zinc oxide (IZO), tin oxide ($SnO_2$), or zinc oxide (ZnO) can be adopted, and from the viewpoint of providing a high-performance element, highly transparent ITO or IZO is preferable.

(Green Red Light Emitting Unit 4A)

The green red light emitting unit 4A has a green red mixed phosphorescent light-emitting layer 4AGR that emits green light and red light, and has a hole transporting surface having a hole transporting property and an electron transporting surface having an electron transporting property as both surfaces, and the green red mixed phosphorescent light-emitting layer 4AGR contains a green color phosphorescent material, a red color phosphorescent material, and a host material for the phosphorescent light-emitting layer.

The green red light emitting unit 4A preferably includes a hole injection layer 4A1, a hole transport layer 4A2, the green red mixed phosphorescent light-emitting layer 4AGR, an electron transport layer 4A3, and an electron injection layer 4A4 in this order from a side of the light-pervious anode layer 3.

The maximum emission peak wavelength of the green color phosphorescent material is preferably 100 nm or more away from the maximum emission peak wavelength of the blue color fluorescent material described later.

(Blue Light Emitting Unit 4B)

As illustrated in FIG. 1B, the blue light emitting unit 4B includes a blue fluorescent light-emitting layer 4BB that emits blue light, has a hole transporting surface having a hole transporting property and an electron transporting surface having an electron transporting property as both surfaces, and includes an HTL adjustment layer 4B1 as a hole transporting layer having an average thickness of 50 nm or more adjacent to the blue fluorescent light-emitting layer 4BB and on the unit connection mechanism side.

The blue fluorescent light-emitting layer 4BB is preferably a light-emitting layer closest to the metal cathode layer 5 and includes a blue color fluorescent material and a fluorescent light emission host material, and the fluorescent light emission host material of the blue fluorescent light-emitting layer 4BB is an electron transporting host material.

The HTL adjustment layer 4B1 includes a light emitting layer of a color different from blue, and may include, for example, a green light emitting layer that emits green light. The HTL adjustment layer 4B1 preferably includes a hole-transporting green fluorescent light-emitting layer containing a green fluorescent material and a hole-transporting fluorescent light emission host material.

The blue light emitting unit 4B preferably includes, for example, a hole injection layer 4B2, the HTL adjustment layer 4B1, the blue fluorescent light-emitting layer 4BB, an electron transport layer 4B3, and an electron injection layer 4B4 in this order from the side of the light-pervious anode layer 3.

(Metal Cathode Layer 5)

The metal cathode layer 5 can be formed using various metal materials, and among them, a white glossy metal is preferable, and among them, silver (Ag) or aluminum (Al) is more preferable.

(Out-Coupling Layer)

In order to improve the angle-dependent optical characteristics of luminance and color of the organic EL element 10, it is preferable that an out-coupling layer 6 (OCL) is provided on an outermost surface of a region including at least the light emitting region 11 on the side of the light emission surface 12.

Hereinafter, the layers and materials used above will be described in detail.

(Hole Injection Layer)

The hole injection layer is, for example, a layer that takes in holes from the positive electrode (light-pervious anode layer 3) and injects holes into the hole transport layer. Furthermore, as the hole injection layer, a hole transporting material doped with an electron-accepting dopant can also be preferably employed from the viewpoint of improving the luminance by improving the transparency of the hole injection layer. The hole injection layer preferably has an average thickness of 0.1 nm or more and 20 nm or less.

(Hole Transport Layer)

The hole transport layer is a layer that restricts movement of electrons to the positive electrode (light-pervious anode layer 3) side while efficiently transporting holes from the hole injection layer side to the light emitting layer.

As a material of the hole transport layer, a known hole transporting material can be used. The hole transport layer preferably has an average thickness of 1 nm or more and 200 nm or less.

(Light-Emitting Layer)

The light-emitting layer is generally a layer obtained by doping a luminescent material into a host material having hole transport properties or electron transport properties, and is a layer in which holes flowing in from the hole transport layer and electrons flowing in from the electron transport layer are bonded by application of an electric field, and light-emitting excitons are generated.

The light-emitting layer preferably has an average thickness of 1 nm or more and 40 nm or less.

(Electron Transport Layer)

The electron transport layer is a layer that restricts the movement of electrons to the negative electrode (metal cathode layer 5) side while efficiently transporting electrons from the electron injection layer side to the light emitting layer.

As a material of the electron transport layer, a known electron transporting material can be used.

The electron transport layer preferably has an average thickness of 1 nm or more and 200 nm or less.

(Electron Injection Layer)

The electron injection layer is, for example, a layer that takes in electrons from the negative electrode (metal cathode layer 5) and injects electrons into the electron transport layer.

For the electron injection layer, from the viewpoint of improving the luminance by improving the transparency of the electron injection layer, an electron transporting material doped with an electron-donating dopant can also be preferably employed.

The electron injection layer preferably has an average thickness of 0.1 nm or more and 20 nm or less.

(Hole Transporting Material)

As the hole transporting material, for example, a triphenylamine-based compound, a carbazole-based compound, or the like can be employed.

(Electron Transporting Material)

Examples of the electron transporting material include a quinolinolato-based metal complex, an anthracene-based compound, an oxadiazole-based compound, a triazole-based compound, a phenanthroline-based compound, and a silol-based compound.

(Luminescent Material)

Luminescent materials include fluorescent materials and phosphorescent materials that generally have higher luminous efficiency than fluorescent materials.

As the red-based fluorescent light-emitting material, rubrene, DCM, DCM2, DBzR, and the like can be adopted.

As the green fluorescent light-emitting material, coumarin 6, C545T, or the like can be employed.

As the blue fluorescent light-emitting material, perylene 4,4'-bis (9-ethyl-3-carbazovinylene)-1,1-biphenyl (BCzVBi), 4,4'-bis [4-(di-p-triamino) styryl] biphenyl (DPAVBi), or the like can be adopted.

Examples of the red-based phosphorescent light-emitting material include (bzq)2Ir(acac), (btp)2Ir(acac), Ir(bzq)3, and Ir(piq)3, which are iridium complexes.

As the green color phosphorescent light-emitting material, (ppy)2Ir(acac), Ir(ppy)3, and the like, which are iridium complexes, can be employed.

As the blue color phosphorescent light-emitting material, FIrpic, FIr6, Ir(Fppy)3, and the like, which are iridium complexes, can be employed.

(Electron-Accepting Dopant)

As the electron-accepting dopant, a tetracyanoquinodimethane-based compound, molybdenum oxide ($MoO_3$), tungsten oxide ($WO_3$), vanadium oxide ($V_2O_5$), and the like can be employed.

(Electron-Donating Dopant)

As the electron-donating dopant, an alkali metal, an alkaline earth metal, a rare earth metal, a compound of these metals, a phthalocyanine complex having these metals as a central metal, a dihydroimidazole compound, or the like can be employed.

According to the organic EL element 10 of the present embodiment, since white light having a low blue light emission intensity and a high color rendering property is emitted, a load for visual recognition of objects including color tones is reduced, the organic EL element is gentle to the eyes in a living environment at night, can contribute to improvement of the quality of sleep, and is suitable as wellness illumination.

According to the organic EL element 10 of the present embodiment, the green red light emitting unit 4A includes the green red mixed phosphorescent light-emitting layer 4AGR containing a green color phosphorescent material, a red color phosphorescent material, and a host material for the phosphorescent light-emitting layer. Therefore, the ratio between the green phosphorescence and the red phosphorescence is kept constant without being affected by the position of the emission interface that moves depending on the amount of current, and the change in color tone due to the magnitude of the current can be minimized. That is, high reliability can be secured with respect to color rendering properties and whiteness.

According to the organic EL element 10 of the present embodiment, since the green red light emitting unit 4A is located on a light emission side (a side of the glass substrate 2) with respect to the blue light emitting unit 4B, the blue light emitted by the blue light emitting unit 4B is emitted through the green red light emitting unit 4A. Therefore, the blue emission spectrum intensity can be reduced.

Figure 2:
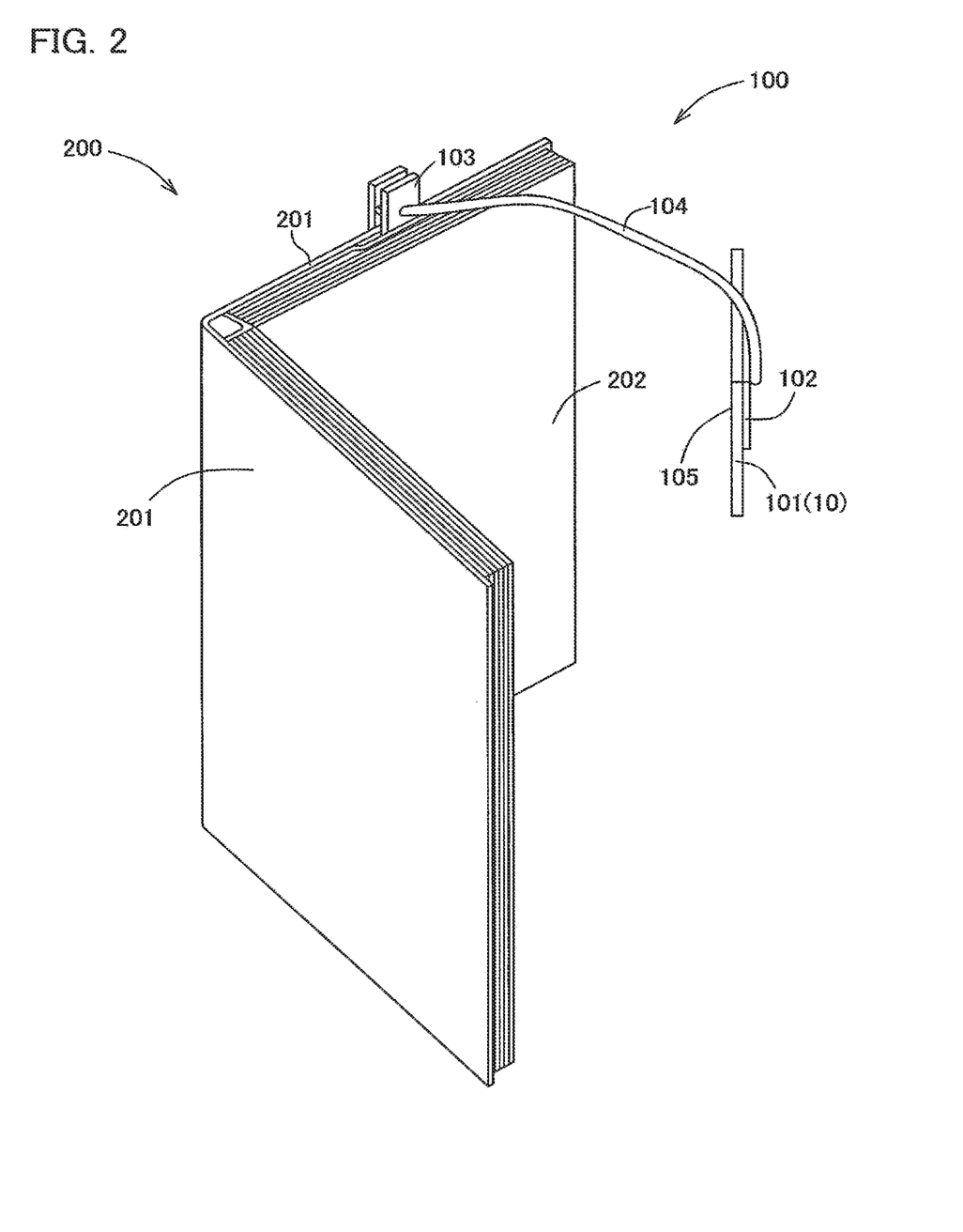
FIG. 2 is a perspective view of an illuminating device according to the first embodiment of the present invention.

Subsequently, an illuminating device 100 using the organic EL element 10 of the present embodiment will be described.

As illustrated in FIG. 2, the illuminating device 100 includes an organic EL panel 101, a holding portion 102, a clip portion 103 (fixing portion), and a connecting unit 104, and illuminates an object 200 to be viewed with the organic EL panel 101.

The organic EL panel 101 includes an organic EL element 10 and a battery unit (not illustrated), and can emit diffused light from a light emission surface 105 by supplying electric power stored in the battery unit to the organic EL element 10.

The battery unit is preferably a secondary battery that can be charged and discharged, and is preferably a lithium ion secondary battery from the viewpoint of being lighter.

The holding portion 102 is a portion that holds the organic EL panel 101.

The clip portion 103 is a fixing portion that is fixed to the object 200 to be viewed by being sandwiched by a part of the object 200 to be viewed.

The connecting unit 104 is a portion that connects the holding portion 102 and the clip portion 103, is capable of changing the position and direction of the holding portion 102 with respect to the clip portion 103, and is specifically a flexible arm.

Next, a case where the illuminating device 100 of the present embodiment is used to be attached to a book which is an example of the object 200 to be viewed will be described.

As illustrated in FIG. 2, the cover 201 of the book which is the object 200 to be viewed is sandwiched by the clip portion 103, and the position and the direction of the connecting unit 104 are adjusted to direct the organic EL panel 101 so that the light emission surface 105 faces the paper surface 202 of the book. Then, the organic EL panel 101 is turned on, and the paper surface 202 is irradiated with light.

According to the illuminating device 100 of the present embodiment, by attaching the organic EL panel 101 to the cover 201 of the object 200 to be viewed with the clip portion 103 and directing the organic EL panel toward the paper surface 202 of the object 200 to be viewed, the burden on the user's eye is small even when viewing the paper surface 202 of the object 200 to be viewed immediately before going to bed at night, and it is possible to suppress the deterioration of the quality of sleep due to the suppression of the melatonin generation by light.

In the embodiments described above, the HTL adjustment layer 4B1 includes a green fluorescent light-emitting layer, but the present invention is not limited thereto. The HTL adjustment layer 4B1 may not include a green fluorescent light-emitting layer. That is, the HTL adjustment layer 4B1 may not emit light.

In the above embodiment, the clip portion 103 is used as the fixing portion, but the present invention is not limited thereto. The fixing portion may be another fixing means such as a screw or a hook.

In the above embodiment, the case where the object 200 to be viewed is a book has been described, but the present invention is not limited thereto. The object 200 to be viewed may be any object that can be visually recognized by the user and fixed by the fixing portion.

In the embodiment described above, each component can be freely replaced or added between the embodiments as long as it is included in the technical scope of the present invention.

EXAMPLES

Hereinafter, the present invention will be specifically described with reference to Examples and Comparative Examples. Note that the present invention is not limited to the following examples, and can be appropriately modified without changing the gist.

Example 1

Figure 8:
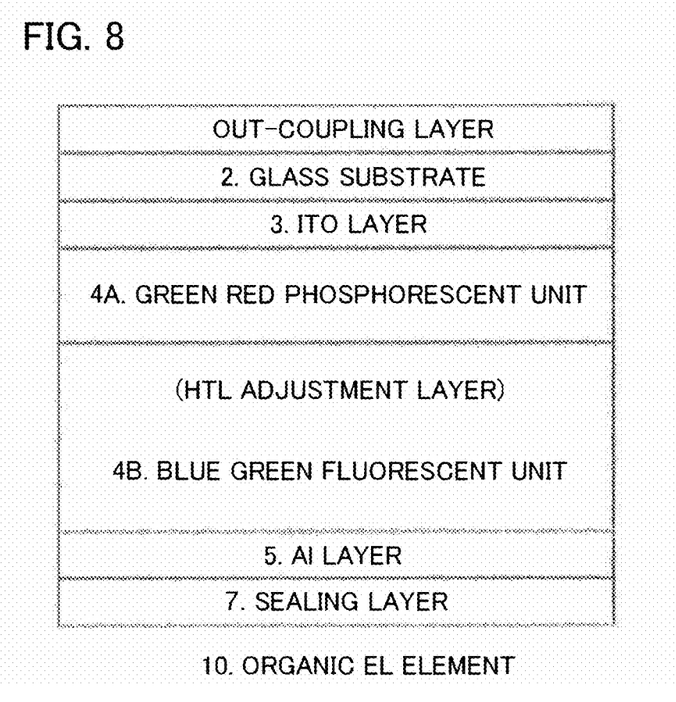
FIG. 8 is a cross-sectional configuration diagram of a white light emitting organic EL element of Example 1.

The organic EL element 10 of Example 1 has a configuration as illustrated in the cross-sectional configuration diagram of FIG. 8, and an ITO layer 3 is sequentially formed as the light-pervious anode layer 3 on an element-forming surface of the glass substrate 2, and then the green red phosphorescent unit 4A, the blue green fluorescent unit 4B, and an Al layer 5 as the metal cathode layer 5 is sequentially formed on the ITO layer 3 to complete a two-stage stacked element of anode layer 3/green red phosphorescent unit 4A/unit connection mechanism/blue green fluorescent unit 4B/cathode layer 5.

Here, in order to reduce the deviation duv from the blackbody radiation while alleviating the increase in the intensity of the blue light due to reflection at the metal cathode layer 5, the blue green fluorescent unit 4B is configured to include the HTL adjustment layer 4B1 of 80 nm thickness, which functions as a green light-emitting layer as well as a thick hole transporting layer and is adjacent to the blue fluorescent light-emitting layer 4BB on the unit connection mechanism side. The blue fluorescent light-emitting layer 4BB in the blue fluorescent unit 4B is configured to be 27 nm.

Here, the green red mixed phosphorescent light-emitting layer in the green red phosphorescent unit 4A is 15 nm, and the cathode layer side ETL is 50 nm.

Figure 3:
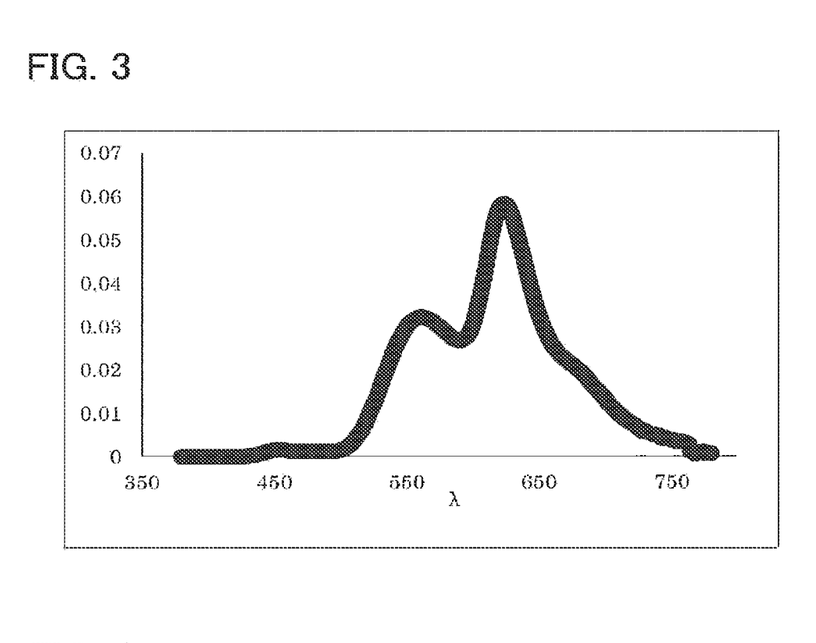
FIG. 3 is a front emission spectrum of the organic EL element of Example 1.
Figure 4:
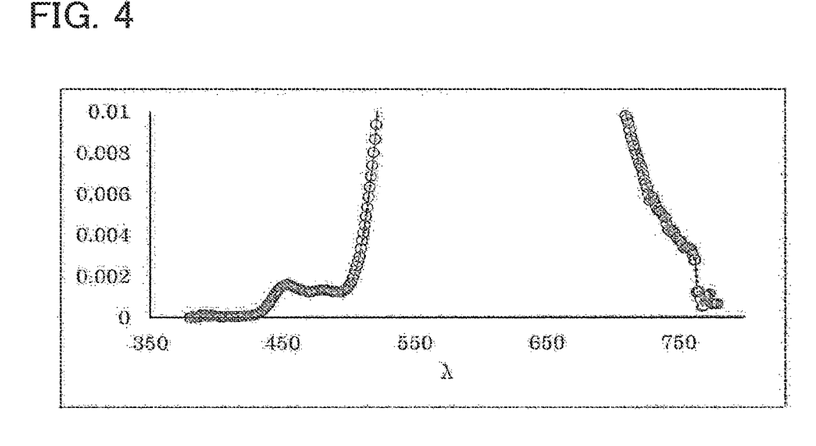
FIG. 4 is a spectrum obtained by enlarging a blue region in FIG. 3.

FIG. 3 is a front emission spectrum at a current density of 3 mA/cm 2 of the organic EL element of Example 1, and FIG. 4 is a blue region spectrum of FIG. 3. That is, in FIG. 4, the scale of the vertical axis is changed focusing on the blue emission spectrum.

The color temperature TCP of the emitted light of the organic EL element of Example 1 calculated from the spectrum in FIG. 3 was 2250 K, the deviation duv from the black-body radiation was 0.011, the color reproducibility Ra was 80, and the Melanopic Ratio value, which is an index of the degree of stimulation to the retinal nerve cells of the eye, was 0.208.

Furthermore, FIG. 4 illustrates that the organic EL element of Example 1 has one blue emission peak in the range of 450 nm to 470 nm.

The measurement results are summarized in Table 1 together with other Examples and Comparative Examples.

TABLE 1

| | HTL adjustment layer (nm) | Color temperature TCP (K) | duv | Average color rendering index Ra | Melano picratio value |
|---|---|---|---|---|---|
| Example 1 | 80 | 2250 | 0.011 | 80 | 0.208 |
| Example 2 | 90 | 2350 | 0.00018 | 88 | 0.407 |
| Example 3 | 55 | 2921 | −0.009 | 94 | 0.632 |
| Comparative Example 1 | 45 | 3526 | 0.0131 | 89 | 0.605 |
| Comparative Example 2 | 40 | 3516 | −0.00195 | 90 | 0.681 |
| Comparative Example 3 | 8 | 2273 | 0.019 | 78 | 0.204 |

Comparative Example 1

The organic EL element of Comparative Example 1 was an over 3000 K class high color rendering element, and the same glass substrate 2, ITO layer 3, and Al layer 5 as in Example 1 were used, and as the light-emitting functional layer 4, the blue light emitting unit 4B and the green red light emitting unit 4A were formed in this order between ITO layer 3 side and the Al layer 5 side, so that a two-stage stacked element of anode layer 3/blue light emitting unit 4B/green red light emitting unit 4A/cathode layer 5 was obtained. That is, the green red light emitting unit 4A is provided on the Al layer 5 side with respect to the blue light emitting unit 4B, and is different from Example 1 in that a unit connection mechanism is not provided.

In the same manner as in Example 1, as a result of calculation from the front emission spectrum of the organic EL element of Comparative Example 1, the color temperature TCP was 3526 K, the duv was 0.013, the Ra was 89, and the Melanopic Ratio value was 0.605.

Example 2

The organic EL element of Example 2 is the same as that of Example 1 except that the thickness of the HTL adjustment layer is 90 nm and the cathode layer side ETL is 70 nm.

Figure 5:
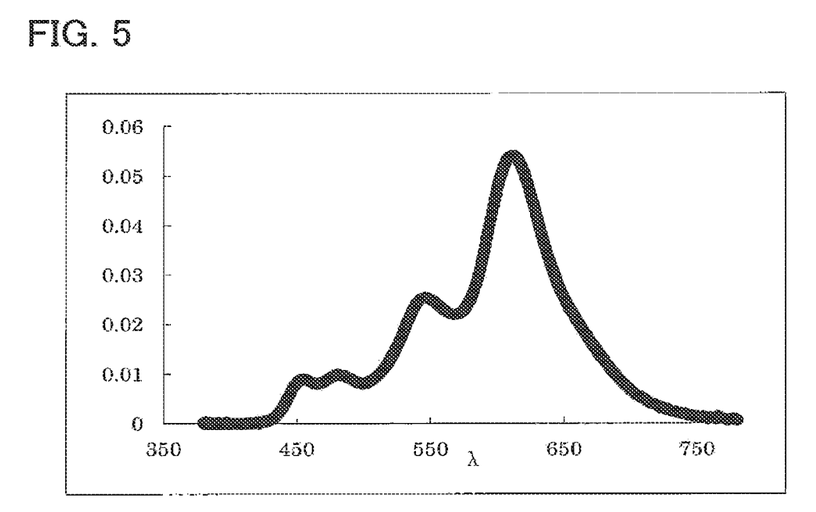
FIG. 5 is a front emission spectrum of an organic EL element of Example 2.

FIG. 5 is a front emission spectrum of the organic EL element of Example 2 at the time of lighting at a current density of 3 mA/cm$^2$.

Similar to Example 1, when the organic EL element was lit at a current density of 3 mA/cm$^2$, the color temperature TCP was 2350 K, the duv was 0.00018, the Ra was 88, and the Melanopic Ratio value was 0.407 as calculated from the front emission spectrum of the organic EL element of Example 2.

Comparative Example 2

The organic EL element of Comparative Example 2 is the same as that of Example 1 except that the thickness of the HTL adjustment layer is 40 nm and the thickness of ETL on a side of the cathode layer 5 is 50 nm.

Figure 6:
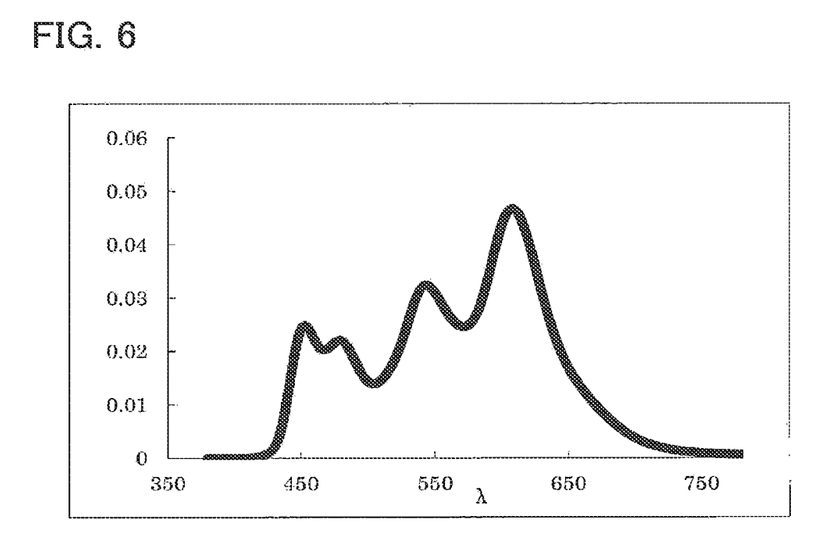
FIG. 6 is a front emission spectrum of an organic EL element of Comparative Example 2.

FIG. 6 is a front emission spectrum of the organic EL element of Comparative Example 2 at the time of lighting at a current density of 3 mA/cm$^2$.

In the same manner as in Example 1, as a result of calculation from the front emission spectrum of the organic EL element of Comparative Example 2, the color temperature TCP was 3516 K, the duv was −0.00195, the color reproducibility Ra was 90, and the Melanopic Ratio value was 0.681.

Example 3

The organic EL element of Example 3 is the same as that of Example 1 except that the thickness of the HTL adjustment layer is 55 nm, the thickness of the blue fluorescent light-emitting layer in the blue fluorescent unit 4B is 3 nm, the concentration of the blue luminescent material is 1 wt %, the green red phosphorescent light-emitting layer in the green red phosphorescent unit 4A is 23 nm, and the thickness of ETL on the side of the cathode layer 5 is 70 nm.

FIG. 7 is a front emission spectrum of the organic EL element of Example 3 at the time of lighting at a current density of 3 mA/cm$^2$.

Similar to Example 1, a result of calculation from the front emission spectrum of the organic EL element of Example 3 shows the color temperature TCP was 2921 K, the duv was −0.009, and the Ra was 94, which were favorable, but the Melanopic Ratio value was 0.632.

Comparative Example 3

The organic EL element of Comparative Example 3, which was an organic EL element of having a low color temperature TCP of over 2250 K class, was made in a similar manner to Example 1 except that the HTL adjustment layer was 8 nm.

Similar to Example 1, when calculating from the front emission spectrum of the organic EL element of Comparative Example 3, the color temperature TCP was 2273 K, the duv was 0.019, the color reproducibility Ra was 78, and the Melanopic Ratio value was 0.204.

Summary of Examples and Comparative Examples

The Melanopic Ratio value was 0.605 in Comparative Example 1 for the high color rendering element of over 3000 K class but the Melanopic Ratio value was suppressed to 0.208 in the organic EL element of Example 1. Furthermore, the Melanopic Ratio value of the organic EL element of Example 2 of the present invention was 0.407.

In the emission spectrum of over 3000 K-class high color rendering element of Comparative Example 1, the intensity ratio of blue:green:red is 1:1.5:2.5, and in the emission spectrum of the 2250 K-class low color temperature TCP element of Comparative Example 3, the intensity ratio of blue:green:red is 1:19:36.

In order to reduce the deviation (distance) of the blackbody radiation, the emission intensity of green was lowered, and thus the visibility was lowered. In order to increase the power efficiency as much as possible, in the element of Example 2, the spectral intensity ratio of red to green was adjusted to (red:green) 1.8:1.

Furthermore, the element according to the example was designed so that the blue light emission intensity was suppressed, thereby making it possible to suppress sleep disorder and stimulation to the retinal nerve cells in the eyes, and a Melanopic Ratio value, an index of the degree of stimulation to the retinal nerve cells, was reduced using the element according to the example.

Regarding the organic EL element of Example 3, in general, when the thickness of the blue light-emitting layer is reduced or the content of the blue luminescent material is reduced, the blue light emission intensity tends to decrease. In the organic EL element of Example 3 whose spectrum is illustrated in FIG. 7, the fluorescent blue light-emitting layer is 3 nm and the blue luminescent material is 1 wt %.

In the organic EL element of Example 3, the blue light emission intensity was higher than expected, the color temperature TCP was 3000 K or less, and the Melanopic Ratio value was 0.632. Therefore, from the viewpoint of solving the problem of the present invention, the organic EL element of Example 1 is considered to be most excellent.

EXPLANATION OF REFERENCE CHARACTERS

10: white light emitting organic EL element
2: light-pervious substrate (glass substrate)
3: light-pervious anode layer (ITO layer)
4: light-emitting functional layer
4A: green red light emitting unit
4B: blue light emitting unit
4B1: HTL adjustment layer
4BB: blue fluorescent light-emitting layer
5 metal cathode layer
6: out-coupling layer 7: sealing layer
100: illuminating device
101: organic EL panel
102: holding portion
103: clip portion
104: connecting unit
105: light emission surface
200: object to be viewed

The invention claimed is:

1. An organic electroluminescence (EL) element including a light emission surface and a back surface as both main surfaces,
the organic EL element comprising: a light-pervious substrate; a light-pervious anode layer; a light-emitting functional layer; and a metal cathode layer in order from a side of the light emission surface,
the light-emitting functional layer including: a green red light emitting unit; a unit connection mechanism; and a blue light emitting unit,
the unit connection mechanism being configured to inject electrons to a side of the green red light emitting unit and holes to a side of the blue light emitting unit when energized,
the green red light emitting unit comprising a green red mixed phosphorescent light-emitting layer that includes: a green phosphorescent material; a red phosphorescent material; and a host material for a phosphorescent light-emitting layer,
the green red light emitting unit emitting green light and red light when energized,
the blue light emitting unit including:
a blue fluorescent light-emitting layer that emits blue light when energized; and
a hole transporting layer (HTL) adjustment layer adjacent to the blue fluorescent light-emitting layer on a side of the unit connection mechanism,
the HTL adjustment layer being a hole transporting layer having an average thickness of 50 nm or more,
wherein the EL element is configured to emit white light from the light emission surface,
the white light having:
a correlated color temperature TCP of 2200 K to 3000 K;
a distance duv of 0.02 or less, the distance duv referring to a distance from a black-body radiation curve to a coordinate position of the white light in a CIE1931 chromaticity coordinate system;
a color rendering property Ra of 80 or more; and
a Melanopic Ratio value of 0.65 or less,
wherein the light-pervious anode layer is in direct contact with the green red light emitting unit so as to inject holes into the green red light emitting unit; and
wherein the metal cathode layer is in direct contact with the blue light emitting unit so as to inject electrons into the blue light emitting unit.

2. The organic EL element according to claim 1,
wherein the Melanopic Ratio value is 0.5 or less,
wherein the blue light emitting unit comprises the blue fluorescent light-emitting layer as a light-emitting layer closest to the metal cathode layer, and
wherein the blue fluorescent light-emitting layer comprises: a blue color fluorescent material; and a host material for fluorescent light emission.

3. The organic EL element according to claim 2,
wherein the HTL adjustment layer comprises a green fluorescent light-emitting layer including: a green fluorescent material; and a hole-transporting host material for fluorescent light emission, and
wherein a maximum emission peak wavelength of the blue fluorescent material and a maximum emission peak wavelength of the green phosphorescent material are separated from each other by 100 nm or more.

4. The organic EL element according to claim 3,
wherein a spectrum of the white light has one blue emission peak in a range of 450 nm to 470 nm, one green emission peak in a range of 500 nm to 580 nm, and one red emission peak in a range of 590 nm to 630 nm, and
wherein in the spectrum of the white light, defining an emission intensity of the blue emission peak as 1, an emission intensity of the green emission peak is 2.5 times or more and 3.0 times or less.

5. An illuminating device comprising:
an organic EL panel having the organic EL element according to claim 4,
a holding portion holding the organic EL panel;
a fixing portion fixing the organic EL panel to an object to be viewed; and
a connecting unit connecting the holding portion to the fixing portion,
the fixing portion being capable of changing a position and a direction of the holding portion with respect to the fixing portion,
wherein light can be emitted from the organic EL panel toward the object to be viewed.

6. An illuminating device comprising:
an organic EL panel having the organic EL element according to claim 3,
a holding portion holding the organic EL panel;
a fixing portion fixing the organic EL panel to an object to be viewed; and
a connecting unit connecting the holding portion to the fixing portion,
the fixing portion being capable of changing a position and a direction of the holding portion with respect to the fixing portion,
wherein light can be emitted from the organic EL panel toward the object to be viewed.

7. The organic EL element according to claim 2,
wherein a spectrum of the white light has one blue emission peak in a range of 450 nm to 470 nm, one green emission peak in a range of 500 nm to 580 nm, and one red emission peak in a range of 590 nm to 630 nm, and
wherein in the spectrum of the white light, defining an emission intensity of the blue emission peak as 1, an emission intensity of the green emission peak is 2.5 times or more and 3.0 times or less.

8. An illuminating device comprising:
an organic EL panel having the organic EL element according to claim 7,
a holding portion holding the organic EL panel;
a fixing portion fixing the organic EL panel to an object to be viewed; and
a connecting unit connecting the holding portion to the fixing portion,
the fixing portion being capable of changing a position and a direction of the holding portion with respect to the fixing portion,
wherein light can be emitted from the organic EL panel toward the object to be viewed.

9. An illuminating device comprising:
an organic EL panel having the organic EL element according to claim 2,
a holding portion holding the organic EL panel;

a fixing portion fixing the organic EL panel to an object to be viewed; and a connecting unit connecting the holding portion to the fixing portion, the fixing portion being capable of changing a position and a direction of the holding portion with respect to the fixing portion, wherein light can be emitted from the organic EL panel toward the object to be viewed.

10. The organic EL element according to claim 1, wherein a spectrum of the white light has one blue emission peak in a range of 450 nm to 470 nm, one green emission peak in a range of 500 nm to 580 nm, and one red emission peak in a range of 590 nm to 630 nm, and wherein in the spectrum of the white light, defining an emission intensity of the blue emission peak as 1, an emission intensity of the green emission peak is 2.5 times or more and 3.0 times or less.

11. An illuminating device comprising:

an organic EL panel having the organic EL element according to claim 10, a holding portion holding the organic EL panel;

a fixing portion fixing the organic EL panel to an object to be viewed; and a connecting unit connecting the holding portion to the fixing portion, the fixing portion being capable of changing a position and a direction of the holding portion with respect to the fixing portion, wherein light can be emitted from the organic EL panel toward the object to be viewed.

12. An illuminating device comprising:

an organic EL panel having the organic EL element according to claim 1, a holding portion holding the organic EL panel;

a fixing portion fixing the organic EL panel to an object to be viewed; and a connecting unit connecting the holding portion to the fixing portion, the fixing portion being capable of changing a position and a direction of the holding portion with respect to the fixing portion, wherein light can be emitted from the organic EL panel toward the object to be viewed.

\* \* \* \* \*